(12) United States Patent
Venkitasubramani et al.

(10) Patent No.: US 11,563,409 B2
(45) Date of Patent: Jan. 24, 2023

(54) CONFIGURABLE NON-LINEAR FILTER FOR DIGITAL PRE-DISTORTION

(71) Applicant: Analog Devices International Unlimited Company, County Limerick (IE)

(72) Inventors: Anand Venkitasubramani, Bengaluru (IN); Stephen Summerfield, Melrose, MA (US); Bhavana Muralikrishna, Bangalore (IN); Praveen Chandrasekaran, Bangalore (IN)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 17/304,519

(22) Filed: Jun. 22, 2021

(65) Prior Publication Data

US 2022/0131506 A1     Apr. 28, 2022

Related U.S. Application Data

(60) Provisional application No. 63/198,530, filed on Oct. 26, 2020.

(51) Int. Cl.
   *H04L 27/36*     (2006.01)
   *H03F 1/32*      (2006.01)
   *H04B 1/04*      (2006.01)

(52) U.S. Cl.
   CPC ......... *H03F 1/3276* (2013.01); *H03F 1/3258* (2013.01); *H04B 1/04* (2013.01); *H04B 2001/0433* (2013.01); *H04L 27/368* (2013.01)

(58) Field of Classification Search
   CPC ............. H04W 28/0236; H04W 56/00; H04W 56/0015; H04W 72/042; H04W 72/082;
   (Continued)

(56) References Cited

U.S. PATENT DOCUMENTS 6,298,097 B1   10/2001  Shalom
6,828,858 B2   12/2004  Larson et al.
(Continued)

FOREIGN PATENT DOCUMENTS

EP    2311271 B1    9/2014
EP    2 858 321 B1  8/2018
(Continued)

OTHER PUBLICATIONS

Amin et al., "Digital Predistortion of Single and Concurrent Dual-Band Radio Frequency GaN Amplifiers With Strong Nonlinear Memory Effects", IEEE Transactions on Microwave Theory and Techniques, vol. 65, No. 7, Jul. 2017, in 12 pages.
(Continued)

*Primary Examiner* — Eva Y Puente
(74) *Attorney, Agent, or Firm* — Knobbe, Martens, Olson & Bear, LLP

(57) ABSTRACT

Some embodiments herein describe a radio frequency communication system that can include a transmitter to output an radio frequency (RF) transmit signal, the transmitter including a digital pre-distortion system (DPD) that pre-distorts the RF transmit signal. The DPD system can include a configurable non-linear filter, such as a Laguerre filter, having multiple rows where at least one row operates with a configurable decimation ratio. The DPD system can further include decimators and a crossbar switch coupled between the decimators.

22 Claims, 14 Drawing Sheets

(58) Field of Classification Search
CPC .......... H04W 74/0816; H04W 74/0825; H04L 27/2613; H04L 5/0048; H04L 5/0007; H04L 5/0051; H04L 27/26025; H04L 27/2662; H04L 27/2692; H04L 7/041; H04B 7/0617
USPC .......................................................... 375/397
See application file for complete search history.

(56) References Cited

U.S. PATENT DOCUMENTS

| | | |
|---|---|---|
| 7,149,257 B2 | 12/2006 | Braithwaite |
| 7,330,517 B2 | 2/2008 | Taler et al. |
| 7,418,056 B2 | 8/2008 | Suzuki et al. |
| 7,542,518 B2 | 6/2009 | Kim et al. |
| 7,577,211 B2 | 8/2009 | Braithwaite |
| 7,773,692 B2 | 8/2010 | Copeland et al. |
| 7,848,451 B2 | 12/2010 | Cai et al. |
| 8,023,587 B2 | 9/2011 | Deng et al. |
| 8,248,042 B2 | 8/2012 | Morita |
| 8,798,559 B2 | 8/2014 | Kilambi et al. |
| 9,306,506 B1 | 4/2016 | Zhang et al. |
| 9,338,039 B1 | 5/2016 | Barnes |
| 9,356,592 B2 | 5/2016 | Hwang et al. |
| 9,369,121 B2 | 6/2016 | Jeon et al. |
| 9,374,044 B2 | 6/2016 | Jian et al. |
| 9,705,477 B2 | 7/2017 | Velazquez |
| 9,735,741 B2 | 8/2017 | Pratt et al. |
| 9,787,459 B2 | 10/2017 | Azadet |
| 9,866,269 B1 | 1/2018 | Zhao et al. |
| 10,324,169 B2 | 6/2019 | Tua |
| 10,447,211 B2 | 10/2019 | Rollins et al. |
| 10,498,372 B2 | 12/2019 | Pratt |
| 10,715,702 B1 | 7/2020 | Zhao et al. |
| 11,108,364 B1* | 8/2021 | Barnes .................. H03F 1/3294 |
| 2002/0178133 A1 | 11/2002 | Zhao et al. |
| 2005/0157814 A1 | 7/2005 | Cova et al. |
| 2008/0129379 A1* | 6/2008 | Copeland .............. H03F 1/3241 330/149 |
| 2008/0130787 A1 | 6/2008 | Copeland |
| 2011/0204975 A1 | 8/2011 | Miyashita |
| 2011/0255628 A1 | 10/2011 | Woleben et al. |
| 2012/0176190 A1 | 7/2012 | Goodman et al. |
| 2012/0286985 A1 | 11/2012 | Chandrasekaran et al. |
| 2013/0200948 A1 | 8/2013 | Lee et al. |
| 2013/0329832 A1 | 12/2013 | Morita et al. |
| 2014/0269988 A1 | 9/2014 | Schafferer et al. |
| 2016/0190993 A1 | 6/2016 | Nobbe et al. |
| 2018/0331662 A1 | 11/2018 | Maa et al. |
| 2019/0356345 A1 | 11/2019 | Ota et al. |
| 2020/0244232 A1 | 7/2020 | Cope et al. |
| 2020/0259465 A1 | 8/2020 | Wu et al. |
| 2020/0389194 A1 | 12/2020 | Luo et al. |
| 2021/0067097 A1 | 3/2021 | Wang et al. |
| 2021/0194521 A1* | 6/2021 | Pratt ..................... H03F 1/3247 |
| 2021/0384891 A1* | 12/2021 | Enzinger ................ H03F 3/189 |

FOREIGN PATENT DOCUMENTS

| | | |
|---|---|---|
| EP | 3 166 223 B1 | 9/2020 |
| EP | 3843267 | 6/2021 |
| KR | 10-2018-0088882 | 8/2018 |

OTHER PUBLICATIONS

"ADRV9026 Quad-Channel, Wideband RF Transceiver Platform: 200 MHz Bandwidth Integrated Radio Transceiver Solution". Analog Devices, Inc. www.analog.com, 2019 in 4 pages.

Binari et al., "Trapping Effects in GaN and SiC Microwave FETs". Proceedings of the IEEE, vol. 90, No. 6. (2002), pp. 1048-1058.

Bisi, "Characterization of Charge Trapping Phenomena in GaN-based HEMTs". Università Degli Studi Di Padova, Information Science and Technology. Jan. 28, 2015 in 119 pages.

Chen et al., "The Trap Locations of GaN HEMT by Current Transient Spectroscopy". Global Communication Semiconductors, LLC (GCS). 2017 in 4 pages.

Joh et al., "A Current-Transient Methodology for Trap Analysis for GaN High Election Mobility Transistors". IEEE Transactions On Electron Devices, vol. 58, No. 1. (2010), pp. 132-140.

Medrel et al., "A 10W S-band class-B GaN amplifier with a dynamic gate bias circuit for linearity enhancement", International Journal of Microwave and Wireless Technologies, vol. 6, No. 1, Feb. 2014, pp. 3-11.

Uren et al., "Buffer design to minimize current collapse in GaN/AlGaN HFETs". IEEE Transactions on Electron Devices, vol. 59, No. 12. (2012), pp. 3327-3333.

Yuk et al., "An improved empirical large-signal model for high-power GaN HEMTs including selfheating and charge-trapping effects". IEEE MTT-S International Microwave Symposium Digest, https://ieeexplore.ieee.org/abstract/document/5165806, 2009 in 2 pages.

Zhu et al., "RF Power Amplifier Behavioral Modeling Using Volterra Expansion with Laguerre Functions", 2005 IEEE, pp. 963-966.

Jardel et al. "An Electro thermal Model for AlGaN/GaN Power HEMTs Including Trapping Effects to Improve Large-Signal Simulation Results on High VSWR", IEEE transactions on Microwave theory and Techniques vol. 55, No. 12, Dec. 2007, pp. 2660-2669. (Year: 2007).

Gomes et al., "An Accurate Characterization of Capture Time Constants in GaN HEMTs", IEEE transactions on Microwave theory and Techniques vol. 67, No. 7, Jul. 2019, pp. 2465-2474 (Year: 2019).

Barradas et al. "Compensation of long-term memory effects on GaN HE MT-based power amplifiers", IEEE Trans. Microwave Theory Techniques, vol. 65, No. 9, pp. 3379-3388, Sep. 2017 (Year: 2017).

Tome' et al., "A Multiple-Time-Scale Analog Circuit for the Compensation of Long-Term Memory Effects in GaN H EMT-Based Power Amplifiers", IEEE Transactions On Microwave Theory and Techniques, vol. 68 Issue: 9, Sep. 2020, pp. 3709-3723. (Year: 2020).

Extended European Search Report for EP Application No. 21202951. 6, dated Mar. 23, 2022, in 11 pages.

Sohib, et al., "Digital Predistortion of Single and Concurrent Dual-Band Radio Frequency GaN Amplifiers With Strong Nonlinear Memory Effects" Jul. 2017, in 12 pages.

Office Action of Korean Application No. 10-2021-0138449, dated Sep. 13, 2022, in 5 pages.

Barradas et al., "Compensation of Long-Term Memory Effects on GaN HEMT-Based Power Amplifiers", IEEE Transactions on Microwave Theory and Techniques, pp. 1-10, Mar. 2017.

Ghannouchi et al., "Distortion and impairments mitigation and compensation of single- and multi-band wireless transmitters (invited)", IET Microw. Antennas Propag., vol. 7, No. 7, pp. 518-534, 2013.

* cited by examiner

CONFIGURABLE NON-LINEAR FILTER FOR DIGITAL PRE-DISTORTION

CROSS-REFERENCE TO RELATED APPLICATIONS

This application claims the benefit of priority from U.S. Provisional Patent Application No. 63/198,530, filed Oct. 26, 2020 titled "CONFIGURABLE NON-LINEAR FILTER FOR DIGITAL PRE-DISTORTION," the contents of which are expressly incorporated herein by reference in their entirety.

FIELD OF THE DISCLOSURE

The disclosed technology relates generally to radio transceivers, and more particularly to digital pre-distortion (DPD) techniques in which effects of charge trapping in power amplifiers are compensated.

DESCRIPTION OF THE RELATED TECHNOLOGY

Radio transceivers can be used in a wide variety of radio frequency (RF) communication systems. For example, transceivers can be included in base stations or mobile devices to transmit and receive signals associated with a wide variety of communications standards, including, for example, cellular and/or wireless local area network (WLAN) standards. Transceivers can also be used in radar systems, instrumentation, industrial electronics, military electronics, laptop computers, digital radios, and/or other electronics.

RF communication systems can also include power amplifiers for amplifying RF transmit signals from transceivers to power levels suitable for wireless transmission. Various types of power amplifiers exist, including power amplifiers utilizing silicon (Si)-based devices, gallium arsenide (GaAs)-based devices, indium phosphide (InP)-based devices, silicon carbide (SiC)-based devices, and gallium nitride (GaN)-based devices. Various types of power amplifiers can offer different advantages in terms of cost, performance, and/or frequency of operation. For example, while Si-based power amplifiers generally provide lower fabrication cost, some Si-based power amplifiers are inferior compared to their compound semiconductor counterparts in terms of certain performance metrics.

The devices used in power amplifiers, such as field-effect transistors (FETs) or bipolar transistors, can exhibit various transient non-ideal device characteristics. For example, FETs can trap charge during operation, which may temporarily change the device characteristics, such as effective threshold voltage and/or drain current. There is a need for hardware and/or software solutions to compensate for the transient non-ideal behaviors, including those resulting from charge trapping associated with a power amplifier's transistor(s).

SUMMARY OF THE DISCLOSURE

The present disclosure relates to digital pre-distortion (DPD) systems, and in particular to DPD systems including a configurable non-linear matrix for accounting for charge trapping effects of a power amplifier. In certain embodiments, a DPD system is provided that uses a configurable non-linear filter to provide flexibility to account for charge trapping effects in power amplifiers. For example, the DPD system can include a non-linear filter (for example, a Laguerre filter) in which incoming digital transmit data is decimated using a plurality of decimation ratios and selectively provided to different rows of the non-linear filter (for instance, using a crossbar switch) and in which the rows themselves have configurable coefficients. Thus, the non-linear filter operates with configurable rows, columns, time constants, and decimation for providing flexibility to address charge trapping effects in time ranges spanning from a few microseconds to many milliseconds.

The DPD system works with multiple decimated captures and/or with multiple non-decimated samples, where the decimation can be performed after capture of transmitted data stream and power amplifier (PA) output data stream, and correction for sample and sub-sample time alignment between the 2 streams.

Some embodiments can include a radio frequency (RF) communication system including a transmitter configured to output an RF transmit signal, and a power amplifier configured to amplify the RF transmit signal. Additionally, the transmitter includes a digital pre-distortion system (DPD) configured to pre-distort the RF transmit signal and that includes a configurable non-linear filter having a plurality of rows in which at least one row operates with a configurable decimation ratio.

In some embodiments, the DPD system includes a plurality of decimators, and a crossbar switch coupled between the plurality of decimators and the plurality of rows of the configurable non-linear filter.

In some embodiments, at least a portion of the plurality of decimators have a separately controllable decimation ratio.

In some embodiments, the configurable non-linear filter operates with a plurality of different time constants.

In some embodiments, the configurable non-linear filter compensates for charge trapping effects of the power amplifier.

In some embodiments, the configurable non-linear filter is a Laguerre filter.

In some embodiments, the Laguerre filter operates with a programmable number of filter stages corresponding to matrix columns.

In some embodiments, a plurality of coefficients of the plurality of rows are programmable.

In some embodiments, the configurable non-linear filter further includes a bank of input decimation filters configured to selectively reduce an operating rate of the non-linear filter.

In some embodiments, the configurable non-linear filter further includes a bank of output interpolation filters configured to compensate for the reduced operating rate provided by the bank of input decimation filters.

In some embodiments, the configurable non-linear filter includes two or more rows that share common resources to perform infinite impulse response (IIR) filter.

In some embodiments, all rows of the configurable non-linear filter share the IIR filter.

In some embodiments, the IIR filter includes a transposed pipeline structure with a floating memory stage.

In some embodiments, the configurable non-linear filter further includes a first plurality of a look-up tables (LUTs) configured to provide data to the plurality of rows of the configurable non-linear filter.

In some embodiments, the first plurality of LUTs are configured to provide piece-wise linear interpolation of a non-linear transfer function.

In some embodiments, the configurable non-linear filter further includes a second plurality of LUTs configured to process data outputted from the plurality of rows.

In some embodiments, the DPD system further includes a GMP circuit that operates in combination with the configurable non-linear filter to provide DPD.

In some embodiments, the configurable non-linear filter is rate matched to the GMP circuit.

In some embodiments, the GMP circuit operates on a data stream and the configurable non-linear filter operates on an early version of the data stream.

Some embodiments can include a transmitter for an RF communication system, the transmitter including a digital transmit circuit configured to generate an in-phase (I) transmit signal and a quadrature-phase (Q) transmit signal, wherein the digital transmit circuit includes a digital pre-distortion (DPD) system configured to pre-distort the I transmit signal and the Q transmit signal to compensate for downstream power amplifier non-linearity, wherein the digital pre-distortion system includes a non-linear filter having a plurality of rows in which at least one row operates with a configurable decimation ratio.

In some embodiments, the DPD system includes a plurality of decimators, and a crossbar switch coupled between the plurality of decimators and the plurality of rows and columns of the configurable non-linear filter.

In some embodiments, at least a portion of the plurality of decimators have a separately controllable decimation ratio.

In some embodiments, the configurable non-linear filter operates with a plurality of different time constants.

In some embodiments, the configurable non-linear filter compensates for charge trapping effects.

In some embodiments, the configurable non-linear filter is a Laguerre filter.

In some embodiments, the Laguerre filter operates with a programmable number of filter stages corresponding to matrix columns.

In some embodiments, a plurality of coefficients of the plurality of rows are programmable.

In some embodiments, the configurable non-linear filter further includes a bank of input decimation filters configured to selectively reduce an operating rate of the non-linear filter.

In some embodiments, the configurable non-linear filter further includes a bank of output interpolation filters configured to compensate for the reduced operating rate provided by the bank of input decimation filters.

In some embodiments, the configurable non-linear filter includes two or more rows that share an infinite impulse response (IIR) filter.

In some embodiments, all rows of the configurable non-linear filter share the IIR filter.

In some embodiments, the IIR filter includes a transposed pipeline structure with a floating memory stage.

In some embodiments, the configurable non-linear filter further includes a first plurality of a look-up tables (LUTs) configured to provide data to the plurality of rows of the configurable non-linear filter.

In some embodiments, the first plurality of LUTs are configured to provide piece-wise linear interpolation of a non-linear transfer function.

In some embodiments, the configurable non-linear filter further includes a second plurality of LUTs configured to process data outputted from the plurality of rows.

In some embodiments, the DPD system further includes a GMP circuit that operates in combination with the configurable non-linear filter to provide DPD.

In some embodiments, the configurable non-linear filter is rate matched to the GMP circuit.

In some embodiments, the GMP circuit operates on a data stream and the configurable non-linear filter operates on an early version of the data stream.

Some embodiments disclose a method of digital pre-distortion in an RF communication system. The method includes generating an in-phase (I) transmit signal and a quadrature-phase (Q) transmit signal, pre-distorting the I transmit signal and the Q transmit signal to compensate for a non-linearity of a power amplifier using a digital pre-distortion (DPD) system, and configuring a decimation ratio of at least one row of a non-linear filter of the digital pre-distortion system.

DETAILED DESCRIPTION

Figure 1A:
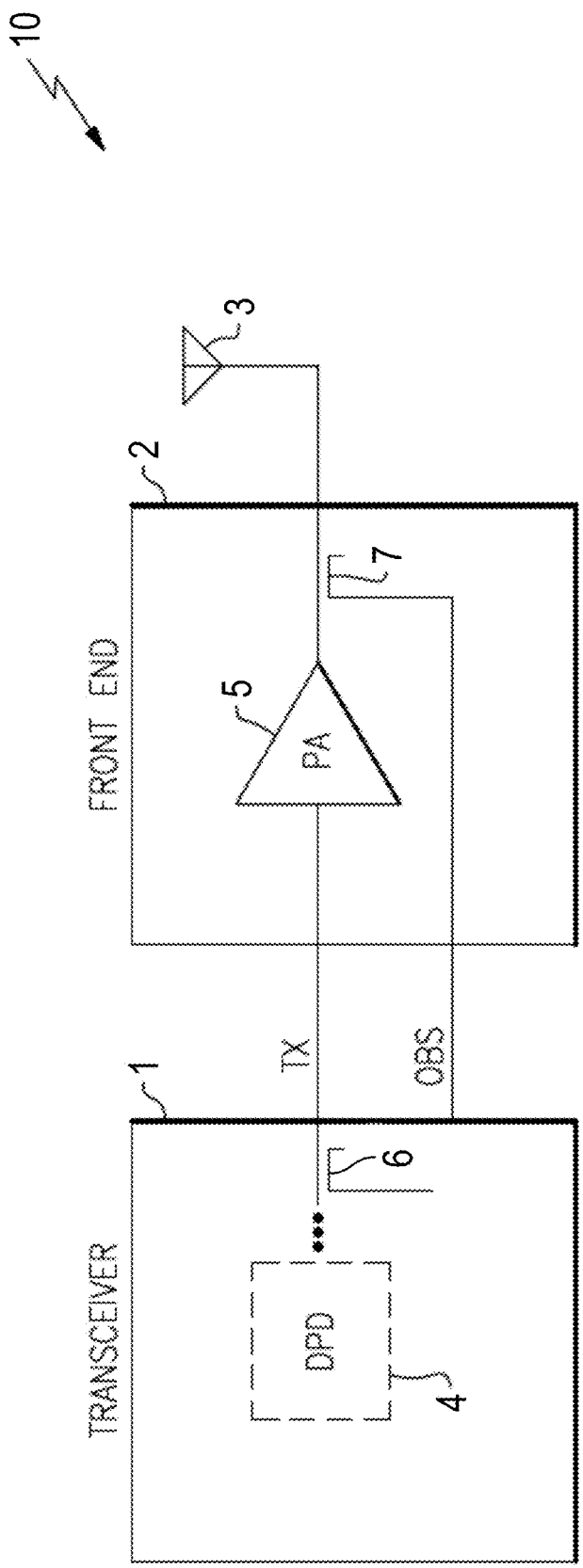
FIG. 1A is a schematic diagram of one embodiment of a radio frequency (RF) communication system.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

As described above, devices for power amplifiers can be based on a variety of different semiconductor material systems. For example, some power semiconductor devices are based on silicon technology, for instance, Si-based laterally diffused metal oxide semiconductor (LDMOS) devices, which may provide a cost advantage over other types of power semiconductor devices. For some applications, such as those with relatively higher frequency (for instance, exceeding 4 GHz), relatively higher power (for instance, exceeding 100 W) and/or relatively higher power efficiency are desired, compound semiconductor-based power semiconductor devices (for instance, GaN-based power amplifiers) may be employed as higher performance alternatives. GaN-based power amplifiers can have certain advantages over other technologies (such as Si-based technologies) including improvements in efficiency and frequency range (for instance, higher unity gain cutoff frequency or $f_\tau$) among other advantages.

While a need for high performance power amplifiers based on compound semiconductors such as GaN has been steadily rising, their implementation has been limited to relatively low volume applications such as military/aerospace. The limited implementation has been due in part due to fabrication costs, which are currently significantly higher than Si-based technologies.

In addition to cost considerations, a need for certain technological improvements has also been recognized for power semiconductor devices based on compound semiconductors. One such improvement is associated with reducing charge trapping and/or mitigating the effects of charge trapping that have been observed in power amplifiers. A variety of detrimental effects of charge trapping have been observed, including, but not limited to, transconductance frequency dispersion, current collapse of the direct current drain characteristics, gate-lag transients, drain-lag transients, and/or restricted microwave power output.

Digital pre-distortion (DPD) systems operate by manipulating the baseband representation of a communications signal. For example, digital compensation can be applied to the in-phase (I) and quadrature-phase (Q) components of a baseband signal using look-up tables (LUTs) and/or multipliers to create a predistorted signal at baseband. When the predistorted signal is upconverted to radio frequency (RF), the added predistortion component allows a downstream power amplifier to output an RF waveform closer to the intended linear upconversion of the original baseband signal.

The present disclosure relates to DPD systems, and in particular to DPD systems including a configurable non-linear matrix for accounting for charge trapping effects of a power amplifier.

In certain embodiments, a DPD system is provided that uses a configurable non-linear filter to provide flexibility to account for charge trapping effects in power amplifiers. For example, the DPD system can include a non-linear filter (for example, a Laguerre filter) in which incoming digital transmit data is decimated using a plurality of decimation ratios and selectively provided to different rows of the non-linear filter (for instance, using a crossbar switch) and in which the rows themselves have configurable coefficients. Thus, the non-linear filter operates with configurable rows, time constants, and decimation for providing flexibility to address charge trapping effects in time ranges spanning from a few microseconds to many milliseconds.

The DPD system works with multiple decimated captures and/or with multiple non-decimated samples, where the decimation can be performed after capture of transmitted data stream and power amplifier (PA) output data stream, and correction for sample and sub-sample time alignment between the 2 streams.

Example RF Communication System Using a DPD Circuit

FIG. 1A is a schematic diagram of one embodiment of an RF communication system 10. The RF communication system 10 includes a transceiver 1, a front end system 2, and an antenna 3. The transceiver 1 includes a DPD circuit 4 and an input power directional coupler 6, while the front end system 2 includes a power amplifier 5 and an output power directional coupler 7.

For clarity of the figure, only certain components of the transceiver 1 and the front end system 2 are depicted. However, the transceiver 1 and the front end system 2 can include additional components. Moreover, other configurations of input power detection and output power detection are possible, including, but not limited to, configurations in which input power detection is performed on the front end system 2.

As shown in FIG. 1A, the transceiver 1 provides an RF transmit signal TX to the front end system 2. Additionally, the RF transmit signal TX is amplified by the power amplifier 5 to generate an amplified transmit signal for the antenna 3.

In this example, the input power directional coupler 6 provides local observation of the power amplifier's input power. Additionally, the output power directional coupler 7 is used to generate an observation signal OBS indicating the power amplifier's output power. Thus, the transceiver 1 operates with observation data indicating the power amplifier's input power and output power. Although one example of observation circuitry for input power and output power is depicted, observation can be performed in other ways.

In the illustrated embodiment, the transceiver 1 generates the RF transmit signal TX with predistortion provided by the DPD circuit 4. The DPD circuit 4 can be implemented with a configurable non-linear matrix in accordance with one or more features of the present disclosure.

Figure 1B:
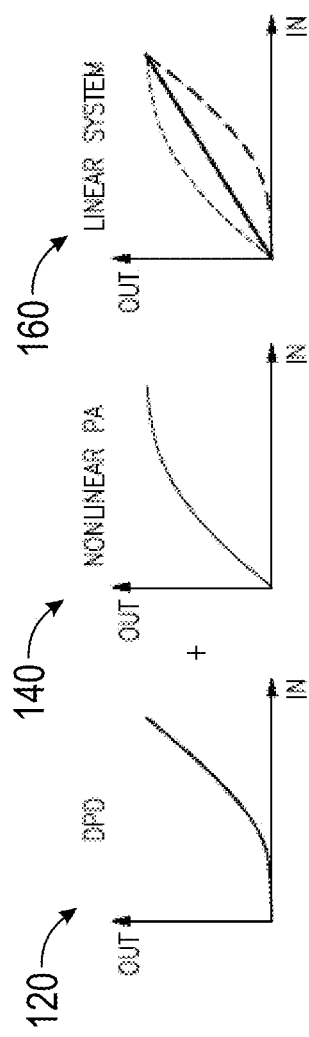
FIG. 1B is a set of graphs depicting one example of power amplifier linearization using digital pre-distortion (DPD).

FIG. 1B is a set of graphs 120, 140, 160 depicting one example of power amplifier linearization using DPD. The graphs include a first graph 120 of output signal versus input signal for the DPD circuit 4 of FIG. 1A. The graphs further include a second graph 140 of output signal versus input signal for the power amplifier 5 of FIG. 1A. The graphs further include a third graph 160 of output signal versus input signal for the combination of the DPD circuit 4 and the power amplifier 5 of FIG. 1A.

As shown in FIG. 1B, the DPD operates to provide pre-emphasis that compensates for power amplifier non-linearity. For example, the DPD can be performed on the complex envelope at baseband to provide a curve fit to an inverse model of the power amplifier. For instance, a sum of polynomials can be fitted to the desired envelope shape that compensates for power amplifier non-linearity.

Figure 1C:
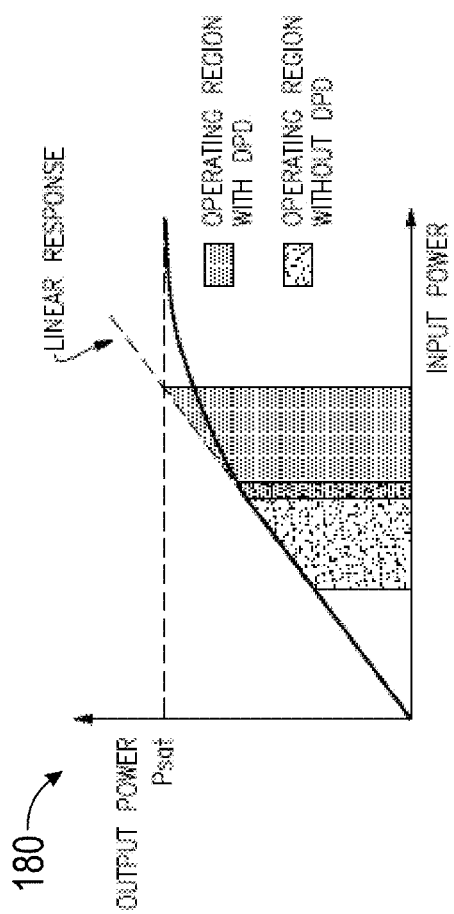
FIG. 1C is a graph of one example of output power versus input power for a power amplifier.

FIG. 1C is a graph 180 of one example of output power versus input power for a power amplifier. The graph 180 represents example performance of the power amplifier 5 of FIG. 1A with and without DPD. As shown in FIG. 1C, the power amplifier 5 can operate at higher input power without gain compression when using DPD.

Example RF Communication System Applying Observed Data to Train a DPD Circuit

Figure 2A:
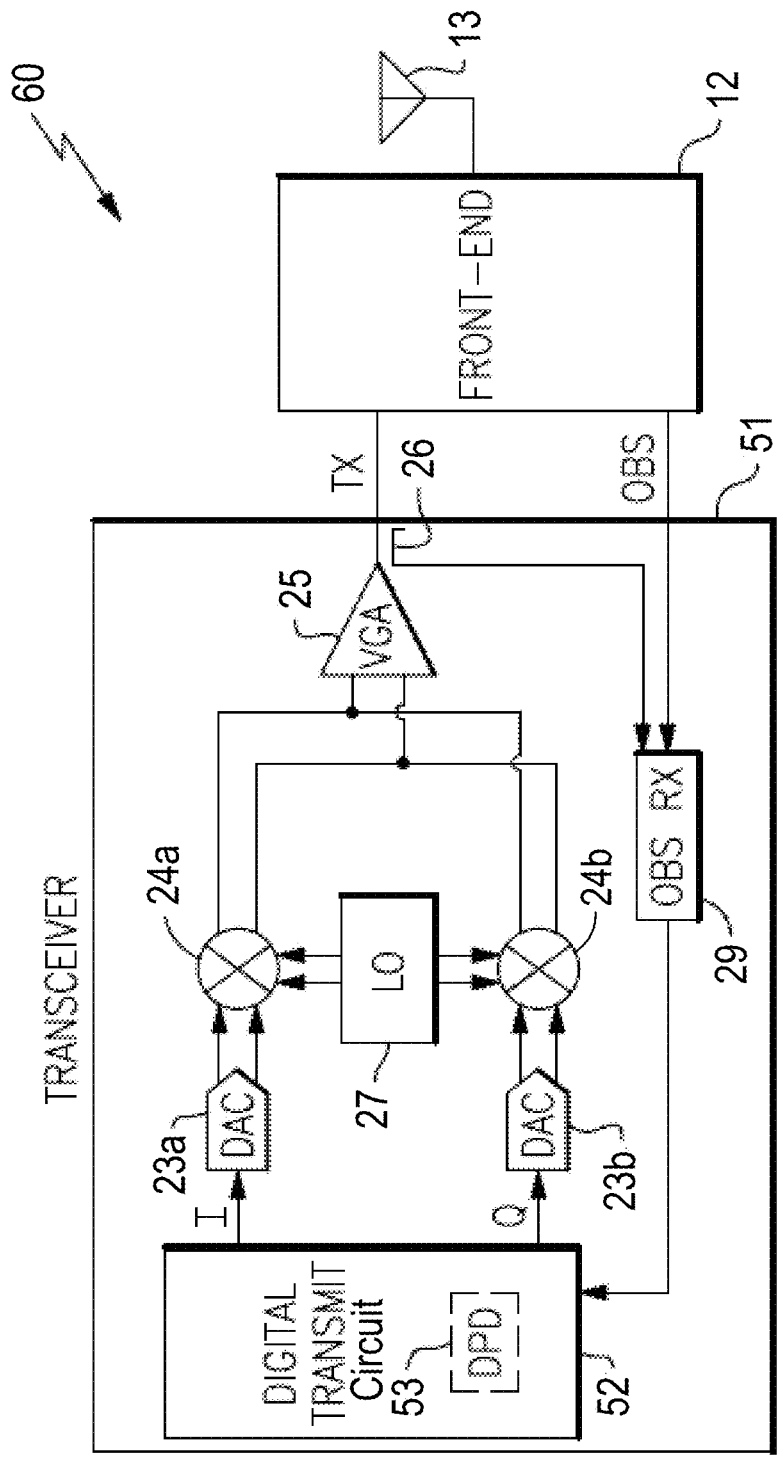
FIG. 2A is a schematic diagram of another embodiment of an RF communication system.

FIG. 2A is a schematic diagram of another embodiment of an RF communication system 60. The RF communication system 60 includes a transceiver 51, a front-end system 12, and an antenna 13.

As shown in FIG. 2A, the transceiver 51 provides an RF transmit signal TX to the front-end system 12, and receives an observation signal OBS from the front-end system 12. Although not shown in FIG. 2A, additional signals can be communicated between the transceiver 51 and the front-end system 12, such as receive signals, control signals, additional transmit signals, and/or additional observation signals.

In the illustrated embodiment, the transceiver 51 includes a digital transmit circuit 52, an I-path digital-to-analog converter (DAC) 23a, a Q-path DAC 23b, an I-path mixer 24a, a Q-path mixer 24b, a variable gain amplifier (VGA) 25, a directional coupler 26, an LO 27, and an observation receiver 29. The digital transmit circuit 52 includes a DPD circuit 53.

Although one example of a transceiver with DPD is shown, the teachings herein are applicable to transceivers implemented in a wide variety of ways. Accordingly, other implementations are possible.

In the illustrated embodiment, the digital transmit circuit 52 generates a pair of quadrature signals, corresponding to a digital I signal and a digital Q signal. The digital I signal and the digital Q signal are generated with DPD. The DPD circuit 53 can include a configurable non-linear filter implemented in accordance with any of the embodiments herein.

In the illustrated embodiment, the I-path DAC 23a converts a digital I signal from the digital transmit circuit 22 into a differential analog I signal. The I-path mixer 24a receives an I clock signal from the LO 27, which the I-path mixer 24a uses to upconvert the differential analog I signal. The Q-path DAC 23b converts a digital Q signal from the digital transmit circuit 22 into a differential analog Q signal. Absent quadrature error, the analog I signal and the analog Q signal have a phase separation of 90 degrees, and can serve as a complex representation of a signal to be transmitted. The Q-path mixer 24b receives a Q clock signal from the LO 27, which the Q-path mixer 24b uses to upconvert the differential analog Q signal. The output of the I-path mixer 24a and the output of the Q-path mixer 24b are combined to generate a differential upconverted signal, which is amplified by the VGA 25 to generate the RF transmit signal TX. The I clock signal and the Q clock signal are differential, in this example.

As shown in FIG. 2A, the observation receiver 29 processes a local observation signal from the directional coupler 26 and the observation signal OBS from the front end system 12 to generate observation data that is provided to the digital transmit circuit 52. The observation data can be used to train the DPD circuit 53. The observation data can also be used for a variety of other functions, such as transmit power control.

In the illustrated embodiment, the I-path mixer 24a and the Q-path mixer 24b are analog mixers, which mix analog I and Q signals.

Figure 2B:
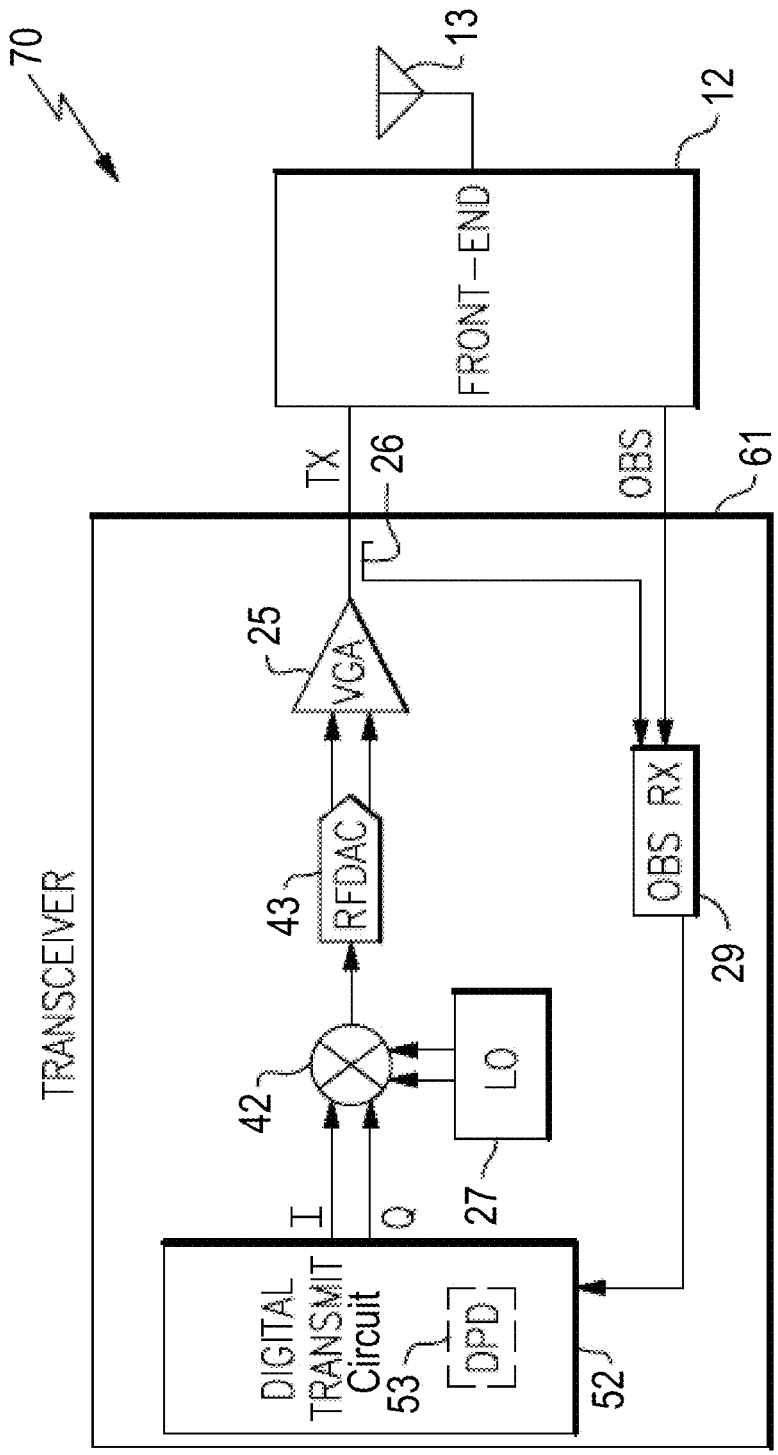
FIG. 2B is a schematic diagram of another embodiment of an RF communication system.

FIG. 2B is a schematic diagram of another embodiment of an RF communication system 70. The RF communication system 70 includes a transceiver 61, a front-end system 12, and an antenna 13.

In the illustrated embodiment, the transceiver 61 includes a digital transmit circuit 52 (including the DPD circuit 53), a digital mixer 42, an RF digital to analog converter (DAC) 45, a VGA 25, a directional coupler 26, an LO 27, and an observation receiver 29.

In comparison to the to the RF communication system 60 of FIG. 2A, the RF communication system 70 of FIG. 2B is implemented to perform mixing prior to analog-to-digital conversion. Accordingly, in contrast to the RF communication system 60 of FIG. 2A that uses analog mixers, the RF communication system 70 of FIG. 2B uses the digital mixer 42.

In the illustrated embodiment, the digital mixer 42 receives a digital I signal and a digital Q signal from the digital transmit circuit 52. The digital I signal and the digital Q signal are generated with DPD. The DPD circuit 53 can include a configurable non-linear filter implemented in accordance with any of the embodiments herein. The digital mixer 52 also receives an I clock signal and a Q clock signal from the LO 27. Furthermore, the digital mixer 52 outputs a digital representation of an upconverted transmit signal, which is processed by the RF ADC 43 to generate an analog upconverted transmit signal (which is differential, in this example). The analog upconverted transmit signal is amplified by the VGA 25 to generate the RF transmit signal TX.

In certain implementations, the digital mixer 42 operates to calculate $((I*LO\_I)-(Q*LO\_Q))$, where I is the digital I signal, Q is the digital Q signal, LO_I is the I clock signal, and LO_Q is the Q clock signal.

In the illustrated embodiment, the transceivers herein can handle signals of a variety of frequencies, including not only RF signals between 30 MHz and 7 GHz, but also signals of higher frequencies, such as those in the X band (about 7 GHz to 12 GHz), the $K_u$ band (about 12 GHz to 18 GHz), the K band (about 18 GHz to 27 GHz), the $K_a$ band (about 27 GHz to 40 GHz), the V band (about 40 GHz to 75 GHz), and/or the W band (about 75 GHz to 110 GHz). Accordingly, the teachings herein are applicable to a wide variety of RF communication systems, including microwave systems.

Example RF Communication System Using a Laguerre Filter

Figure 3:
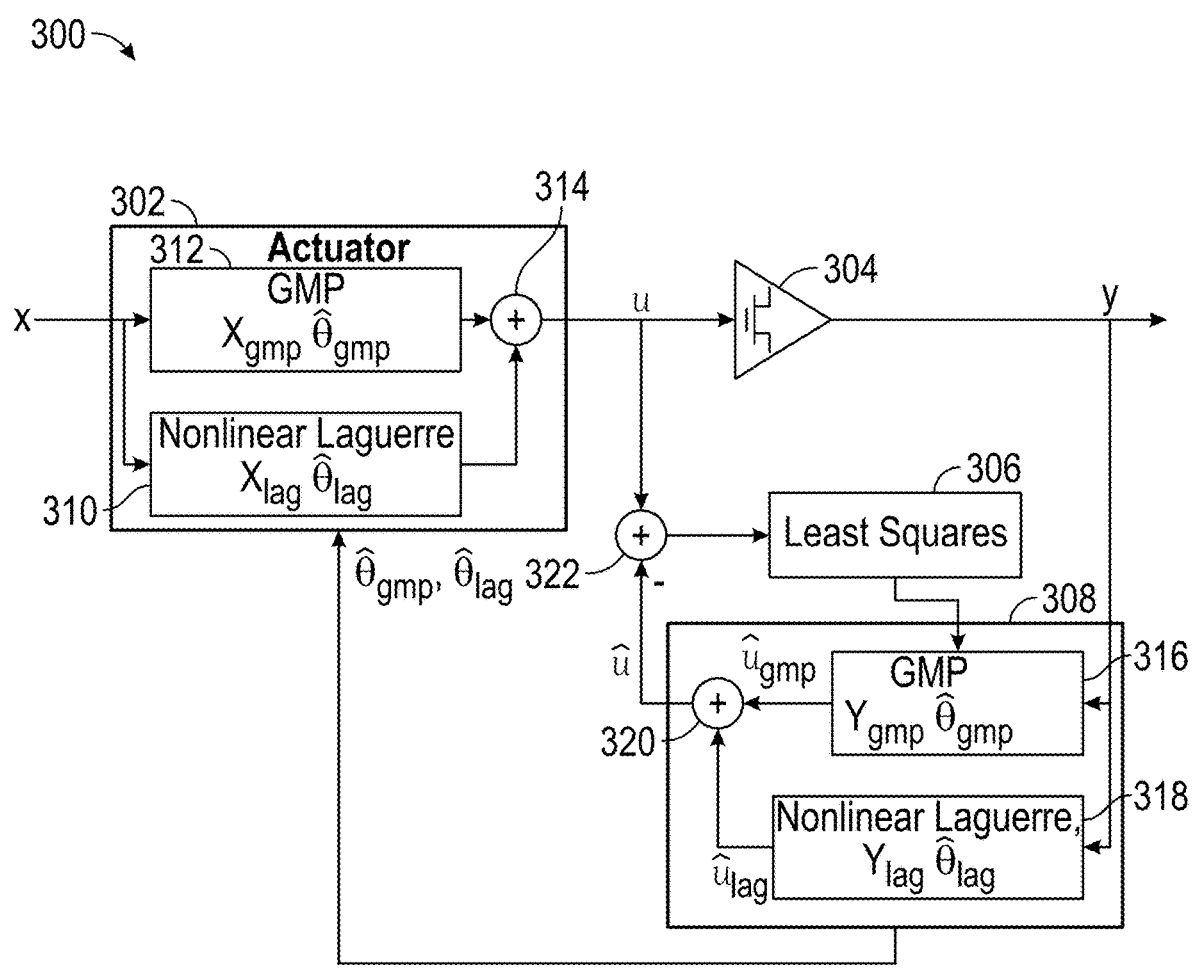
FIG. 3 is a schematic diagram of another embodiment of an RF communication system in which a non-linear Laguerre filter circuit is used to correct low frequency noise and a generalized memory polynomial (GMP) circuit is used to correct high frequency noise.

FIG. 3 is a schematic diagram of another embodiment of an RF communication system 300 in which a non-linear Laguerre filter circuit 310 is used to correct low frequency noise and a generalized memory polynomial (GMP) circuit 312 is used to correct high frequency noise. The RF communication system 300 can correct for both charge trapping effects and broadband distortion of the power amplifier.

FIG. 3 illustrates an RF communication system 300 including a first non-linear filter network (non-linear Laguerre filter circuit 310, in this example) to correct narrow band distortion and a second non-linear filter network (GMP circuit 312, in this example) to correct broad band distortion, according to some embodiments. The RF communication system 300 can include an actuator 302, a power amplifier 304 (including a FET, such as a GaN FET, in this example), a least squares module 306, and a feedback actuator 308.

In the illustrated embodiment, the actuator 302 can include a first non-linear filter network 310 configured to compensate for narrowband distortion of a power amplifier, such as frequencies from 10 kHz to 0.1 Hz. The first non-linear filter network 310 can include a plurality of non-linear filters, such as infinite impulse response (IIR) filters. The IIR filters can collectively function as a Laguerre filter, in this embodiment. The first non-linear filter network 310 can include a cascade or a chain of IIR filters. In some embodiments, the first filter is a low pass filter, and the following filters in the chain of IIR filters are all pass filters. In some embodiments, the filters of the first non-linear filter network 310 are orthogonal to each other. The use of IIR filters enables the system to use long time constants to account for the narrowband charge trap effect. Laguerre filters have not been known to be used for correcting narrowband charge trapping effects. The non-linear filter can be implemented in accordance with any of the embodiments herein.

In some embodiments, the second non-linear filter network 312 can be configured to compensate for broadband distortion of the power amplifier. The second non-linear filter network 312 can include a plurality of non-linear filters, such as finite impulse response (FIR) filters. The FIR filters can collectively function as a general memory polynomial (GMP) filter or GMP circuit. In some embodiments, the second non-linear filter network 312 can include digital predistortion (DPD) systems and/or DPD filter networks that compensate for broadband distortion. The GMP circuit can be configured to compensate for high frequency noise of the power amplifier. Although an example with a GMP circuit is shown, other implementations are possible, including, but not limited to, implementations in which a filter implements a Volterra series.

In some embodiments, the input signal x is fed into the first non-linear filter network 310 to generate a signal to compensate for the narrowband distortion. The same input signal can be fed into the second non-linear filter network 312 to compensate for the broadband distortion. A combination of the output of the first non-linear filter network 310 and the second non-linear filter network 312 is added by the adder 314. The output of the adder 314 is fed into the power amplifier 304. In some embodiments, the input signal x corresponds to a stream of digital data (such as in-phase (I) and quadrature-phase (Q) data) provided by a baseband processor.

Although shown as being directly provided to the power amplifier 304, the output of the adder 314 can correspond to digital pre-distorted transmit data that is processed by one or more, digital-to-analog converters (DACs), one or more mixers, one or more variable gain amplifiers (VGAs), and/or other circuitry to generate an RF transmit signal provided to an input of the power amplifier 304.

In some embodiments, the output and the input to the power amplifier 304 is also used to fit an inverse model, such as the feedback actuator 308. The feedback actuator can serve to train the actuator used for applying DPD. The output of the power amplifier 304 can be fed into another first non-linear filter network 318 and another second non-linear filter network 316. In some embodiments, the input power and/or output power of the power amplifier 304 is captured by a directional coupler, and then processed by an observation receiver to generate a digital representation of the observed power.

With continuing reference to FIG. 3, the output of the other first non-linear filter network 318 and other second non-linear filter network 316 are added by the adder 320. Then, the input of the power amplifier 304 is subtracted by the output of the adder 320 via another adder 322, in this embodiment. The output of the other adder 322 is processed through a least squares module 306. The output of the least squares module 306 is used by the other second non-linear filter network 316.

In some embodiments, the feedback actuator can comprise a first non-linear filter network, such as a Laguerre filter, and a second non-linear filter network, such as a GMP filter.

In some embodiments, the first non-linear filter network is arranged in parallel with the second non-linear filter network. In the illustrated embodiment, the non-linear filter and the GMP circuit are arranged in parallel. In other embodiments, the first non-linear filter network is arranged in series with the second non-linear filter network. The first non-linear filter network is arranged after the second non-linear filter network, where the second non-linear filter network accommodates for the high frequency distortion, and the first non-linear filter network accommodates for the low frequency charge trapping distortion.

In the illustrated embodiment, the power amplifier 304 amplifies an RF signal having a carrier frequency. Additionally, the narrowband distortion corrected by the first non-linear filter network 310 (for instance, a Laguerre filter) can correspond to distortion surrounding a limited bandwidth around the carrier frequency and occurring over long timescales associated with the charge trapping dynamics. For example, a bandwidth BW around the carrier frequency can be inversely proportional to a time constant $\tau$ (BW$\propto$1/$\tau$), and thus charge trapping effects are associated with long time constants and narrow bandwidth. Such narrowband distortion is also referred to herein as low frequency noise of a power amplifier.

In the illustrated embodiment, the broadband distortion corrected by the second non-linear filter network 312 (for instance, a GMP filter) can include non-linearity in the power amplifier (non-charge trap nonlinearities) occurring over much shorter time scales than the narrowband distortion. Thus, the time constant associated with such non-linearity is small and the corresponding bandwidth is wide. Such broadband distortion is also referred to herein as high frequency noise of a power amplifier.

Figure 4A:
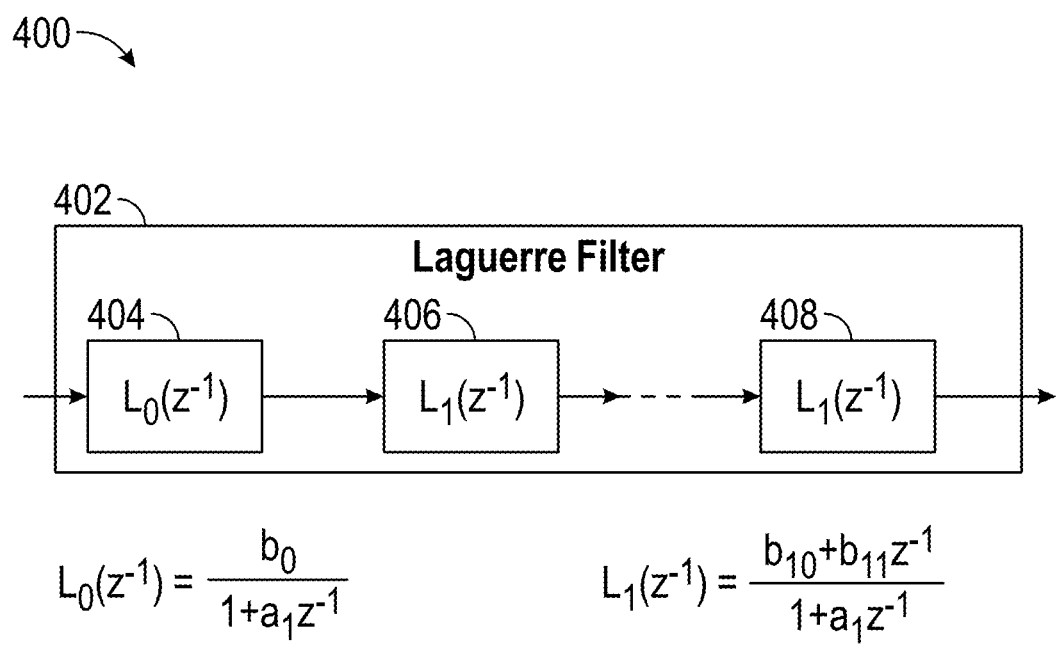
FIG. 4A illustrates an example architecture for identifying initial conditions for the Laguerre actuator training.

FIG. 4A illustrates an example architecture 400 for building a Laguerre filter matrix using 1 row and 3 columns of Laguerre filters. The first filter in each row can include a low pass filter, while the other filters in the same row can be all pass filters. All the filters are IIR filters. Transfer functions of these IIR filters are $$\mathcal{L}_0 = \frac{b_0}{1 + a_1 z^{-1}}, \mathcal{L}_1 = \frac{b_{10} + b_{11} z^{-1}}{1 + a_1 z^{-1}},$$

$$a_1 = -e^{-1/\tau F_s}, b_{00} = \sqrt{1 - a_1^2}, b_{10} = -a_1^*, b_{11} = 1,$$

$L_0$ is a low-pass filter, $L_1$ is an ail-pass filter ($\tau$ delay)

"tau" is the time constant and Fs is sampling rate at which the Laguerre structure runs at.

Figure 4B:
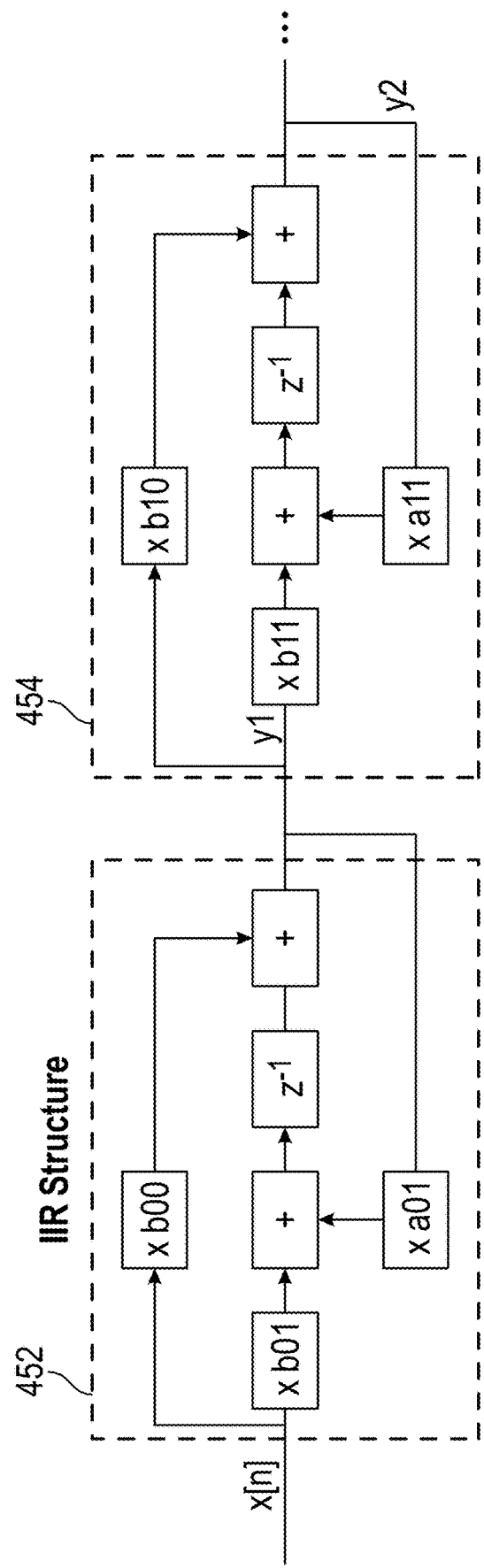
FIG. 4B illustrates signal flow for 2 IIR filters 352, 354 in series (where X indicates multiplier), according to some embodiments

FIG. 4B illustrates signal flow for 2 IIR filters 352, 354 in series (where X indicates multiplier), according to some embodiments. The $1^{st}$ filter 352 in the below diagram is L0 where b01=0; and thus the multiplier vanishes.

Figure 4C:
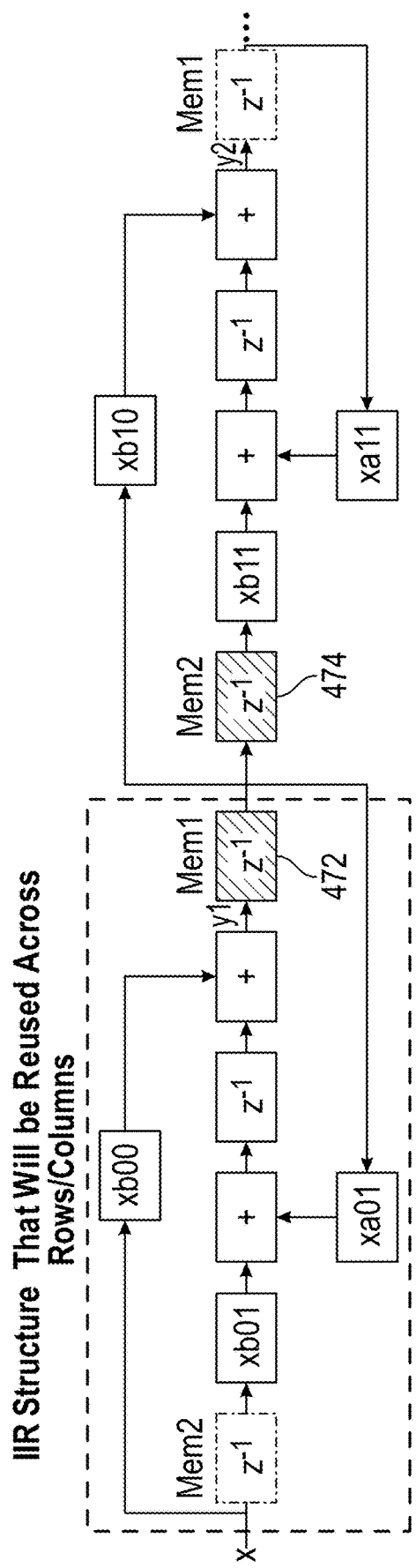
FIG. 4C illustrates signal flow for 2 IIR filters 352, 354 in series (where X indicates multiplier) with floating memories, according to some embodiments

FIG. 4C illustrates signal flow for 2 IIR filters 352, 354 in series (where X indicates multiplier) with floating memories, according to some embodiments. To reuse the multipliers and adders across clock cycles for IIR computation, the system can implement floating memory elements mem1 472 and mem2 474, that remembers the output of each IIR filter and uses it as the input for the next IIR filter in the next clock cycle.

Although certain embodiments herein are depicted in the context of Laguerre filters, the teachings herein are applicable to other implementations of non-linear filters.

Example Architecture for the Configurable Non-Linear Filter

Figure 5:
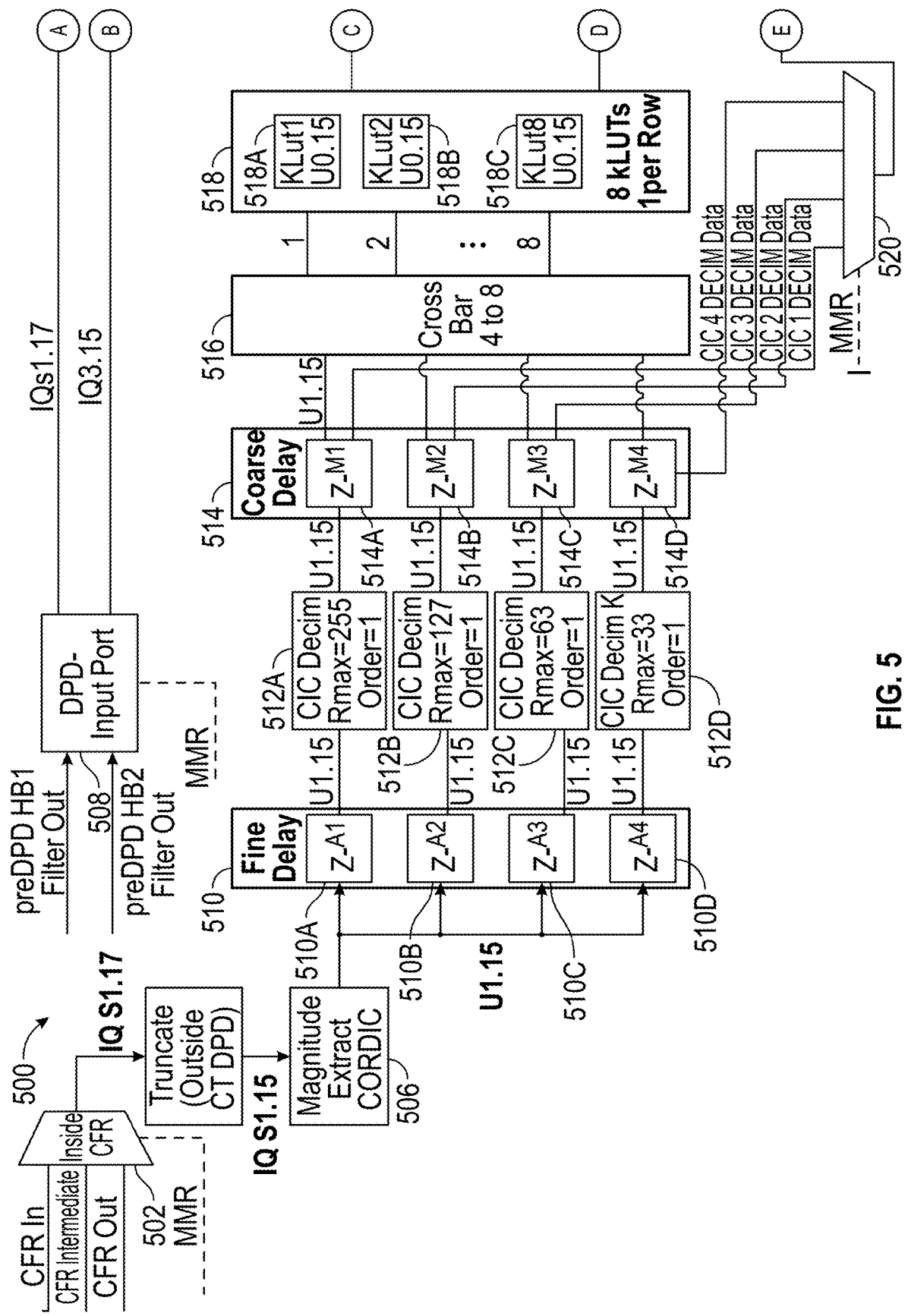
FIG. 5 is a schematic diagram of a configurable non-linear filter according to one embodiment.
Figure 5:
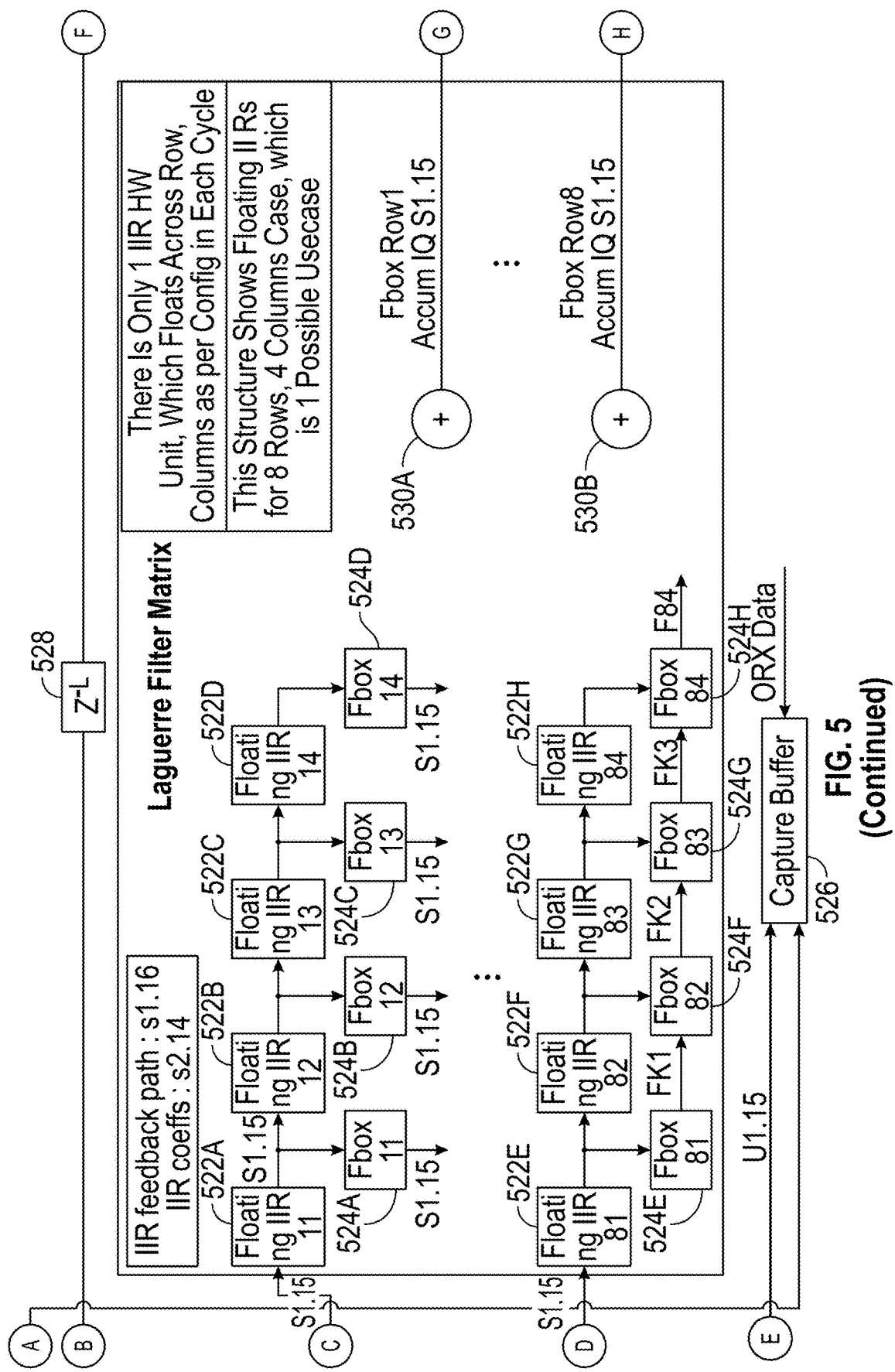
Figure 5:
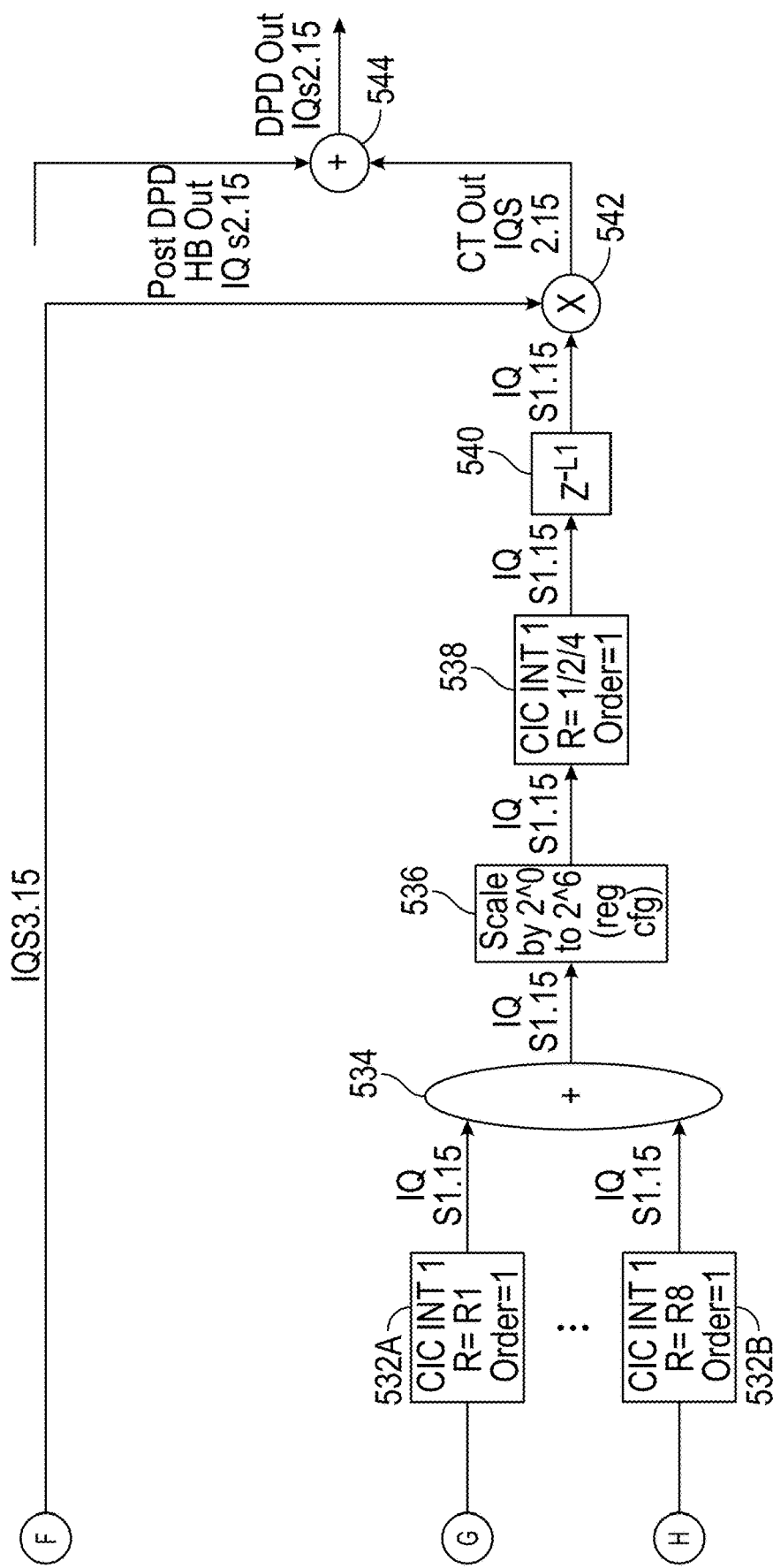

FIG. 5 is a schematic diagram of a configurable non-linear filter 500 according to one embodiment. In this example, the configurable non-linear filter is implemented using a Laguerre filter configuration.

In the illustrated embodiment, the configurable non-linear filter 500 of FIG. 5 provides flexibility to account for charge trapping effects in power amplifiers.

In the illustrated embodiment, the configurable non-linear filter 500 includes a multiplexer 502 that receives various signals (including an input signal, intermediate signal, and output signal, in this example) captured from a signal path through a crest factor reduction (CFR) circuit, explained in more detail below. In some embodiments, the configurable non-linear filter 500 receives not only the output of the CFR circuit, but also the input of the CFR circuit and/or an intermediate signal of the CFR circuit. The output of the CFR circuit can be a signal taken from the output of the CFR circuit before the signal is sent to a GMP actuator.

In the illustrated embodiment, the Laguerre filter operates on magnitude, and thus can operate with magnitude extractor using a CORDIC engine 506 as shown in FIG. 5. In certain implementations, the CORDIC 506 engine operates with adders only and without multipliers, thereby easing hardware implementation. Although an embodiment using CORDIC 506 is depicted, other implementation are possible. The CORDIC engine 506 provides the magnitude of the signal which represents the envelope of the signal.

In the illustrated embodiment, a bank of first order cascaded integrator-comb (CIC) decimation filters 512A, 512B, 512C, 512D are included to reduce the operating rate of the Laguerre filter matrix. Multiple decimation ratios are supported. In certain implementations, an integrate and dump filter is included to eliminate the comb structure in CIC. The decimation filters 512A, 512B, 512C, 512D can perform decimation in parallel. zz In the illustrated embodiment, the data is decimated using multiple decimation ratios and selectively provided to different rows of the non-linear filter (using a crossbar switch 516, in this example) and in which the rows themselves have configurable coefficients. Thus, the non-linear filter operates with configurable rows, columns, time constants, and decimation for providing flexibility to address charge trapping effects in time ranges spanning from a few microseconds to many milliseconds.

In the illustrated embodiment, the four decimation filters 512A, 512B, 512C, 512D each have different decimation ratios. Thus, four copies of the same input signal can each be decimated by different decimation ratios.

In the illustrated embodiment, delay management can also be used for matching the CT DPD data path to the GMP data path. For example, since CIC decimators 512A, 512B, 512C, 512D are included in the embodiment of FIG. 5, the CT DPD data path can have a higher group delay than the GMP path. Although more delay can be intentionally introduced in the GMP path, such latency is undesirable.

To avoid the negative impacts of GMP path delay, an input to the non-linear filter data path can be tapped off an "early" point. Thus, rather than providing the same input data stream to the configurable non-linear filter 500 and the GMP circuit, the configurable non-linear filter 500 can operate with early data. For example, a crest factor reduction (CFR) circuit and one or more halfband filters can be used to process the data stream provided to the GMP circuit, and the non-linear filter can receive data before the CFR circuit and/or halfband filter(s).

To balance the overall delay, the delay can be spread between the decimated rate and input rate and final output rate. Moreover, by delaying at decimated rate, delay line cost is reduced. For example, since 1 unit of delay at decimated rate (input rate by N) is equal to N units of delay at input rate, delay line is reduced by a factor of N. The configurable non-linear filter 500 can apply delays before and/or after the decimation of the signal. For example, fine delays 510A, 510B, 510C, 510D (fine delays 510) can be applied before decimation, and coarse delays 514A, 514B, 514C, 514D (coarse delays 514) can be applied after decimation.

As shown in FIG. 5, a crossbar 516 is included to route any CIC decimation filter to any row of the Laguerre filter matrix. Thus, the crossbar helps to route data associate with a particular decimation ratio to 1 or more rows (time constants). Since the rows have configurable coefficients and thus can operate with different time constants, flexibility for various decimation ratios and time constants is provided. In the illustrated example, there are eight Laguerre filter sets. The crossbar 516 determines which of the four signals will be processed through the eight corresponding Laguerre filters. Thus, the system can assess different models that span different time constants, reducing the load for calibrating the system for a particular power amplifier. Another advantage is that, although a given temperature will exhibit a particular time constant because the charge trapping is reactivated, the system doesn't need to track the changing time constant with ambient air for the power amplifier due to the multiple time constant span.

With continuing reference to FIG. 5, a non-linear transfer function with look up tables in the input power stage (kLUT 518A, 518B, 518C—collectively known as kLUTs 518—in FIG. 5) is implemented using an interpolated LUT. For example, one interpolated LUT per row in the Laguerre matrix can be included.

In certain implementations, the transfer function can be broken into K uniformly spaced piecewise linear regions. However, K non-uniformly spaced piecewise linear regions can alternatively be used to improve local linearity and give more piecewise regions to highly non-linear regions.

In the illustrated embodiment, the LUT can be used to store the (x,y) coordinate of each piecewise linear region along with slope. Additionally, the actual output is obtained by linear interpolation between two successive values of LUT. In certain implementations, slope is computed offline and stored in the LUT while computing LUT contents. In other implementations, slope is computed on the fly in hardware.

In the illustrated embodiment, the LUT can be implemented in a wide variety of ways, for example, a K deep LUT to store the y coordinate of each region. K can have any suitable value including, but not limited to, $2^b$ to make LUT address decoding trivial (b MSbits of input).

With continuing reference to FIG. 5, an interpolated LUT is also used for a non-linear transfer function in the Laguerre IIR output stage (Fboxes 524A, 524B, 524C, 524D, 524E, 524F, 524G, 524H in FIG. 5). In the example of FIG. 5, N LUTs are used, but only one LUT needs to be accessed in a given input cycle. Thus, one monolithic memory unit can be used for storage rather than N memory units, thereby saving area and power. In other embodiments, non-Laguerre non-linear filters can be used instead of the Laguerre filters.

In the illustrated embodiment, the output of the kLUTs are inputted into Laguerre IIR filters 552A, 552B, 552C, 552D, 552E, 552F, 552G, 552H. As noted below in this example, there are eight Laguerre filter sets. Each of the eight Laguerre filter sets include Laguerre filters and Fboxes. For example, the first Laguerre filter set can include Laguerre IIR filters 552A, 552B, 552C, 552D and Fboxes 524A, 524B, 524C, 524D. The fourth Laguerre filter set can include Laguerre IIR filters 552E, 552F, 552G, 552H and Fboxes 524E, 524F, 524G, 524H. In this example, 32 IIR filters are used. As shown in FIG. 5, Fbox accumulators 530A, 530B are used to sum the Fbox outputs in each row. The Fboxes can compute the nonlinearity of the output of the Laguerre filters, which is the actual actuator function for the nonlinear gate correction.

In the illustrated embodiment, the First order CIC interpolators 532A, 532B are included at the output to reverse the effects of CIC decimation at the input. Thus, the CIC interpolators 532A, 532B undo the decimation of the signal by interpolating the signal at the rate before the decimation occurred. Using first order CIC interpolators 532A, 532B allows for simple sample repetition, and thus is of low cost with little to no performance degradation. However, other implementations are possible. The output of the CIC interpolators 532A, 532B can be added via the adder 534 to generate the Laguerre filter output.

In certain embodiments, a second order CIC interpolator (linear interpolator 538) is used to change the rate of input to match the CT DPD data path rate (which can be, for instance, 1× or 2× or 4× the input rate).

In the illustrated embodiment, a filter matrix including a run-time configurable row/column structure of Laguerre IIR filters is provided. The filter matrix works at decimated rate of input rate/N, and up to "N" IIR filters and "N" F-boxes in a row plus column structure are provided. N can be any suitable value, including, for instance, between 2 and 128, or more particularly between 16 and 64 (for instance, 32). Although example values of N are provided, other implementations are possible.

With continuing reference to FIG. 5, the output of the non-linear filter of FIG. 5 can be combined with a GMP circuit (see, for example, the GMP circuit 312 of the embodiment of FIG. 3) via the adder 544. To facilitate such combining, the rate of the non-linear filter can be matched to the rate of the regular data path through the GMP circuit, which might be a higher rate due to interpolating filters in the main data path. The path through a configurable non-linear filter 500 such as that shown in FIG. 5 is also referred to herein as a CT DPD data path. The system can include a programmable scaling control 536 to gain the Laguerre output, for flexibility. The system can include a fine delay element 540 to match residual delay between GMP and Laguerre paths. The system can include a delay 528 on the CT input data to compensate the delay on the Laguerre path, before the data reaches the final complex multiplier. The system can include a selector 520 that selects which decimator (or decimation ratio) for use by the CT DPD adaptation algorithm. Adaptation algorithm works on 1 decimation ratio and the rows which are connected to that decimation ratio, at a time, in a serial fashion. The system can include a capture buffer 526 to capture the decimated LG path data, baseband TX data, and ORX data. The contents are used for the adaptation algorithm, which fine tunes the fLUT/fBox contents and provides linearization. The system can include a DPD-input port 508.

Example Laguerre IIR Filter Matrix

Figure 6:
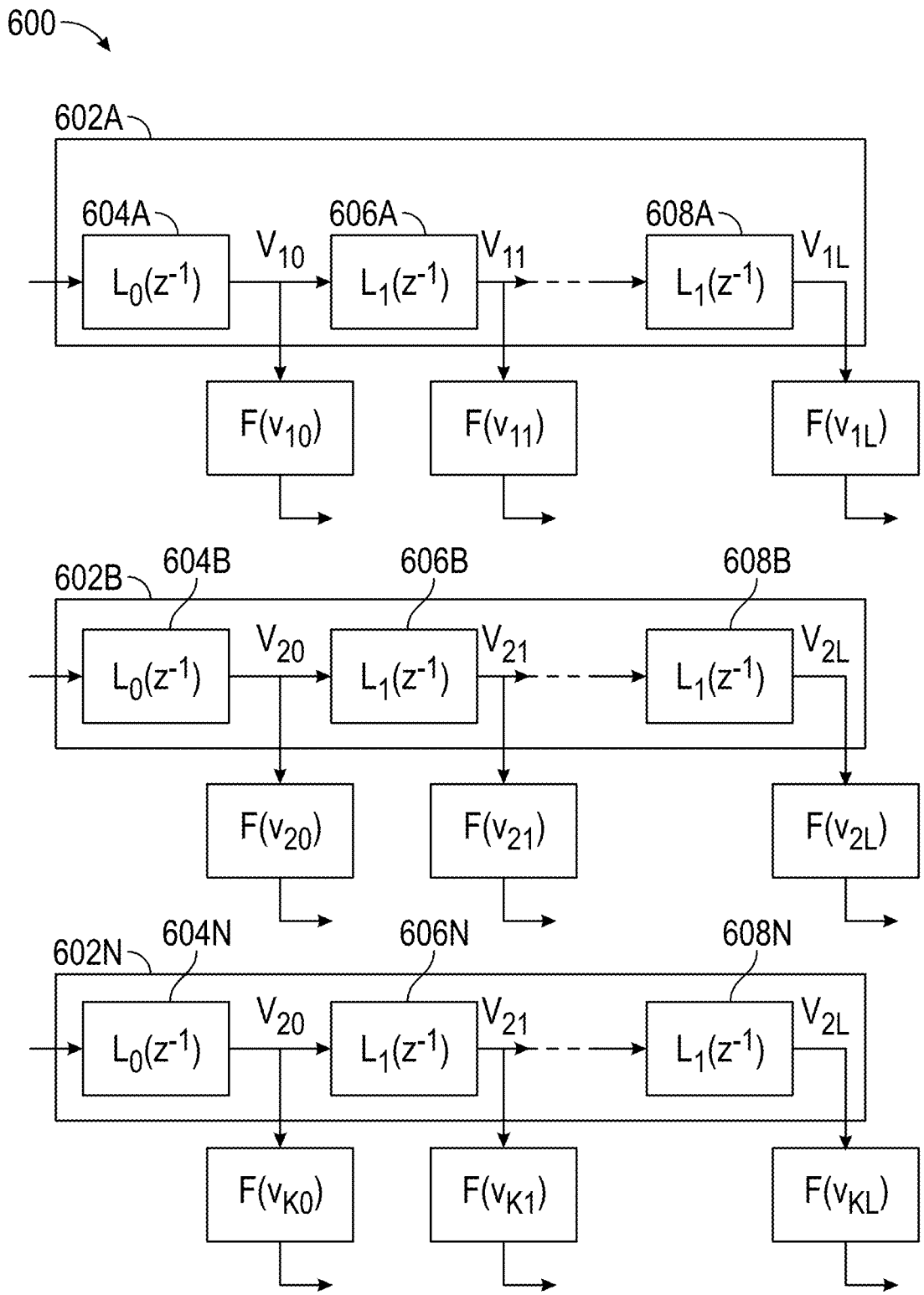
FIG. 6 is a schematic diagram of one embodiment of a Laguerre infinite impulse response (IIR) filter matrix.
Figure 7A:
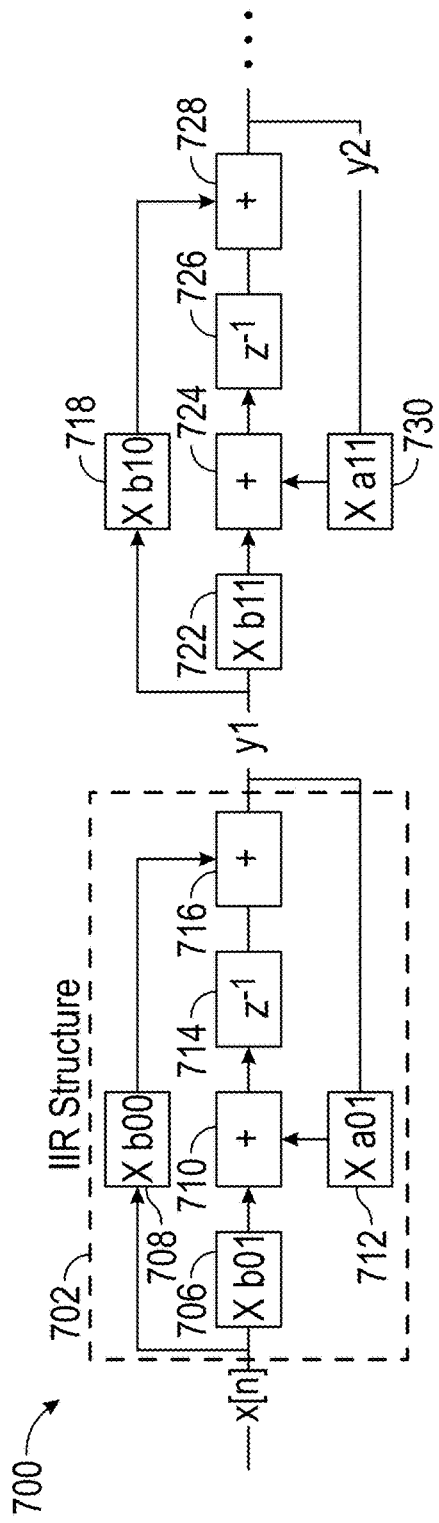
FIG. 7A is a schematic diagram of one embodiment of an IIR transpose structure for the Laguerre filter matrix of FIG. 6.
Figure 7B:
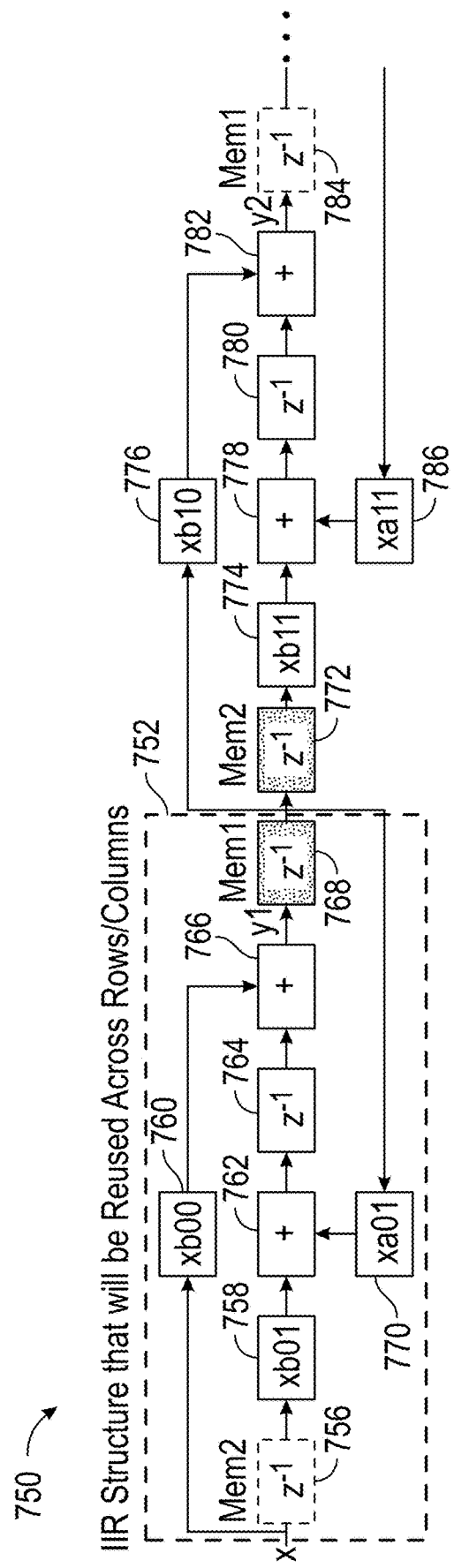
FIG. 7B is a schematic diagram of one embodiment of a transposed pipelined IIR structure for the Laguerre filter matrix of FIG. 6.

FIG. 6 is a schematic diagram of one embodiment of a Laguerre infinite impulse response (IIR) filter matrix 600. FIG. 7A is a schematic diagram of one embodiment of an IIR transpose structure 700 for the Laguerre filter matrix of FIG. 6. FIG. 7B is a schematic diagram of one embodiment of a transposed pipelined IIR structure 750 for the Laguerre filter matrix of FIG. 6. The filter matrix structures of FIGS. 6-7B can be included in a configurable non-linear filter, such as the configurable non-linear filter of FIG. 5.

With continuing reference to FIGS. 5 to 7B, in certain embodiments, each IIR filter is computed in 1 input clock cycle, such that N IIR filters are computed in 1 decimated cycle using 1 HW IIR unit. This reduces area requirement of the Laguerre filter matrix by N.

In certain implementations, rows and columns are programmable. The total active columns in all active rows can be constrained in some implementations (for instance, to not exceed "N").

In certain embodiments, each IIR is 1st order with output being a function of current and previous input, as well as previous output. Thus, the output of each IIR stage is remembered and used to update the state variable and compute output of next state in next cycle.

In some embodiments, the Laguerre infinite impulse response (IIR) filter matrix 600 can include a plurality of stages (1 to N) 602A, 602B, 602N. Each stage 602A, 602B, 602N can include a plurality (1 to M) of non-linear filters, such as Laguerre IIR filters. Each (or at least some) of the 1 to M of filters can include a first non-linear low pass filter (LPF) 604A, 604B, 604N, and possibly one or more non-linear all pass filters 606A, 608A, 606B, 608B, 606N, 608N. For each stage 602A, 602B, 602N, the LPF and possibly one or more all pass filter can be arranged in series. The LPF filter can receive a signal, process the signal through the LPF, output the signal to a series of all-pass filters, and process the signal through the all-pass filters. In some embodiments, the filters of the first non-linear filter network are orthogonal to each other. For example, the LPF can allow signals with frequencies lower than a certain cutoff frequency to pass through the LPF, and the subsequent all-pass filters can allow signals to pass with only a phase modification and no or minimal effect on the magnitude.

The nonlinear functions $F(v_{kl})$ can include a memory polynomial expansion of $v_{kl}$, for example, $$F(v_{kl}) = \sum_{m,q}^{M,Q} f_{mq} v_{kl}^{q}(n-m).$$

In some embodiments, the stages 602A, 602B, 602N (e.g., the 1 to M filters, each stage can include a LPF and possibly one or more all-pass filters) are arranged in parallel to each other. In some embodiments, each of the 1 to M of filters include a corrective element, described in further detail herein. Each of the stages 602A, 602B, 602N can account for a different time constant, as the charge trap distortion can occur in multiple responses across various time scales.

In some embodiments, a complex baseband signal is received from the digital upconverter (x), which can include an in-phase and quadrature-phase (I/Q) signal. The system generates an envelope of the signal by determining an absolute signal of the complex baseband signal via an absolute value block. For example, a coordinate rotation digital computation (CORDIC) circuit can be used for processing digital I and digital Q data to generate a digital envelope. The absolute value block outputs the envelope of the signal.

In some embodiments, the system propagates the output of the absolute value block to a plurality of corrective elements. The plurality of corrective elements introduce non-linearity to the signal. For example, the plurality of corrective elements can take exponentials of the outputs of the absolute value block. A first corrective element can take a 1 exponential of the output of the absolute value block. A second corrective element can take a 2 exponential of the output of the absolute value block. The N corrective element can take an N exponential of the output of the absolute value block. Thus, the corrective elements take non-linear powers of the envelope.

In some embodiments, the outputs of the 1 to N corrective elements are propagated to corresponding 1 to N plurality of non-linear filters 602A, 602B, 602N, such as 1 to N Laguerre filters. The first filters 604A, 604B, 604N can include low pass filters, and the remaining filters 606A, 606B, 606N, 608A, 608B, 608N can include all-pass filters. The following are numerical representations of the Low Pass Filter (LPF) and the all-pass Filters (BPF).

Stage 0: LPF, $$L_0(z^{-1}) = \frac{b_o}{1 + a_1 z^{-1}}$$

Stage 1 to L: BPF, $$L_1(z^{-1}) = \frac{b_{10} + b_{11} z^{-1}}{1 + a_1 z^{-1}}$$

$$a_1 = -e^{-1/\tau F_s}, b_{00} = \sqrt{1 - a_1^2}, b_{10} = -a_1^*, b_{11} = 1$$

The $a_1$ is a filter coefficient, $F_s$ is the sampling rate (e.g., in the 100 MHz range), and $\tau$ is a time constant (e.g., microseconds, milliseconds) of the charge trap effect. The time constant can be determined by looking at the charge trap effect of the power amplifier. Then, the $a_1$ filter coefficient can be determined.

In some embodiments, the outputs of the 1 to N plurality of non-linear filters 256A, 256B, 256N are summed via an adder to generate a low frequency gain term $g_{lag}$. The low frequency gain term $g_{lag}$ represents the narrowband frequency correction gain.

In some embodiments, the low frequency gain term $g_{lag}$ is multiplied by the complex baseband signal input via the multiplier to generate a correction signal to correct for the charge trapping effect $u_{lag}$.

In some embodiments, the first non-linear network and/or the second non-linear network is at least partially implemented in software (e.g., implemented by the digital signal processor as an all digital solution). In some embodiments, the first non-linear network and/or the second non-linear network is at least partially implemented in firmware.

As shown in the embodiments 700 of FIG. 7A, the entire Laguerre IIR matrix 702 is computed with an x[n] as input, and uses 3 multipliers 706, 708, 712 and 2 adders 710, 716. The Laguerre IIR matrix 702 outputs y1, which is the input to the next cycle. The next cycle uses the same multipliers 722, 718, 730 and adders 724, 728 to determine y2. Moreover, as shown in FIG. 7B, a transposed pipeline structure 750 with a floating memory stage can be used. Then for the third cycle (not shown), the y2 would become the new input to the Laguerre IIR matrix and the same multipliers and adders would be used with y2 as the new input. Thus, the multipliers and adders are reused across time such that each cycle of the 1 IIR is computed. In certain embodiments, in addition to the delays 714, 726 of FIG. 7A, the mem1 768 and mem2 772 float in space from 1 stage to next across time (cycles).

In FIG. 7B, the input x is stored in mem2 756, and the multipliers 760, 758, 770 are used to determine y1, and y1 is used as input to the next cycle, where the multipliers 776, 774, 786 and adders 778, 782 are used to compute y2. The transpose pipelined IIR structure (with just 1 multiply and add in 1 cycle) is good for high frequency operation. Furthermore, if there is a clock that is M times faster than input clock, M*N IIR, Fboxes can be computed or an input clock that is slower by a factor of M can be supported.

In certain embodiments, a filter matrix is implemented with arbitration. For example, arbitration of IIR hardware resources among different row requesters can be used.

Such arbitration can be beneficial since different rows can run at different decimation ratios and their decimation phases can be asynchronous with each other, and in certain implementations only one IIR hardware unit is provided to be shared across time.

In certain embodiments, a round robin arbitration is used. For example, a first row "r" is granted the IIR resources for the number of columns in that row; once that is done "r+1" th row is attended if it has requested access to IIR resource; else r+2, . . . .

Such an approach is advantageous since a row cannot request for resource sooner than N cycles, where N is decimation ratio. For instance, in one implementation with N=32, the limiting case would be that 7 rows requested access in the same cycle and their requests are queued to be granted one after another; and in the immediate next cycle 8th row requested access. If each row has 4 columns (4 IIRs), 28 cycles will elapse before 8th row gets access to IIR resources. It will still finish in cycles 29-32 and can request access only at the 33rd cycle, as minimum decimation ratio is 32.

Example Timing Diagram for Decimation of Data

Figure 8:
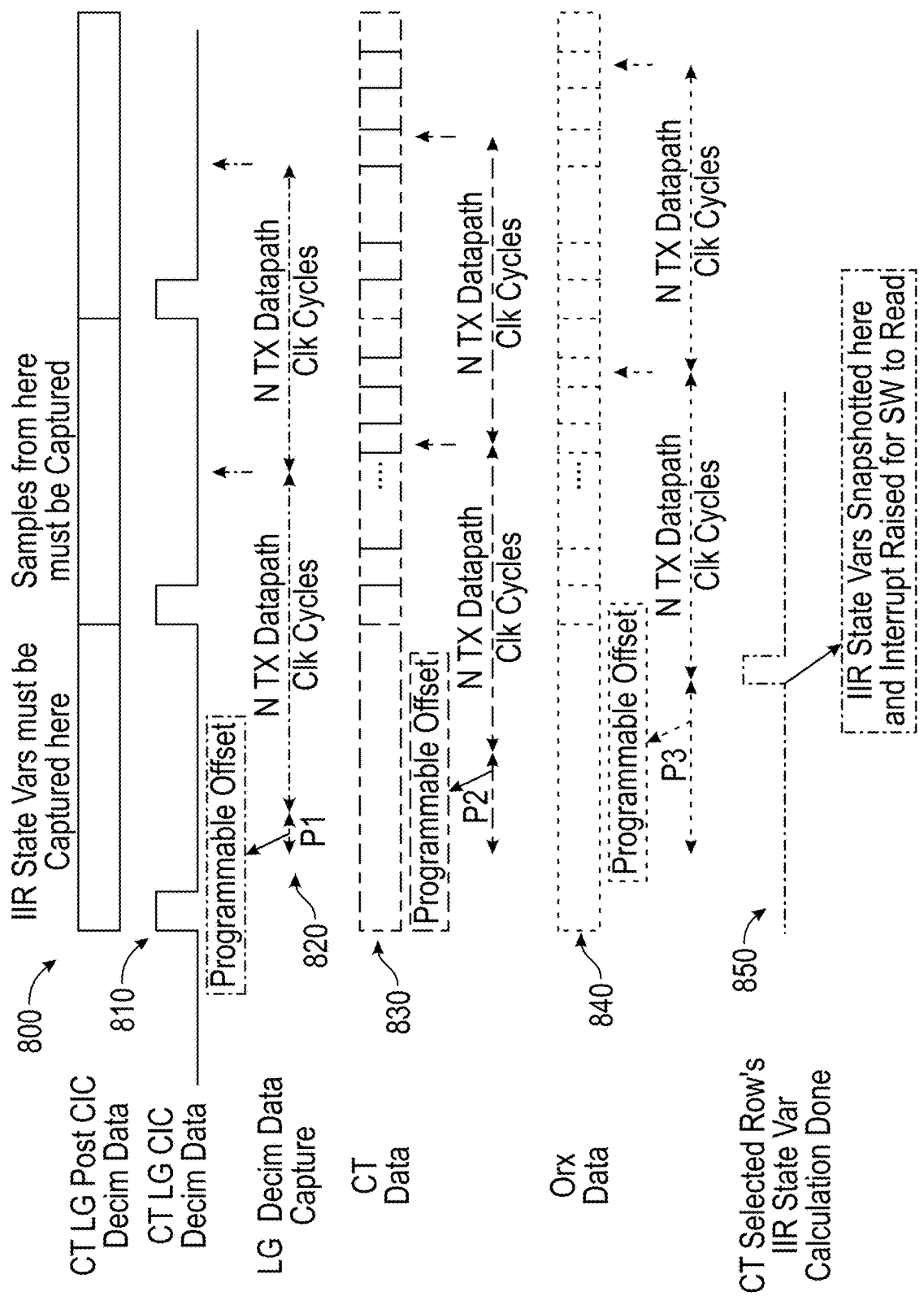
FIG. 8 is a graph depicting one embodiment of capture of decimated data for adaptation.

FIG. 8 is a graph depicting one embodiment of capture of decimated data for adaptation. In the graph 800, the system first determines the IIR state variables to determine the current state of the IRR (first pulse of graph 810). Then, when the current state of the IIR is known, the system can begin calculating the next outputs given the new input (second pulse of graph 810). Thus, the system captures samples, the inputs from the next decimated cycle. The input that is captured can include the input to the Laguerre filter, the output of the power amplifier such as the graph 840. The graph 830 includes the CFR output which gets modulated by the Laguerre filter. The decimated data capture is captured in cycles, as shown in graph 820.

In certain embodiments, adaptation is done in software for a given decimation ratio across multiple time constants. For example, each time constant can be handled by a given row of Laguerre matrix by controlling the IIR coefficients. The IIR coefficients determine the time constant (or vice versa).

In the illustrated embodiment, the adaptation process tries to arrive at an estimated model of the power amplifier to which the DPD is being applied.

In certain embodiments herein, decimated Laguerre output in the model and downsampled non-linear filter data path signal is used to build the power amplifier model. Power amplifier output is also downsampled and processed by an observation receiver.

To produce decimated Laguerre output in the model, the current state of IIR filters in the actuator and successive decimated input samples in the actuator are needed to build the IIR output from a particular point in time. Decimated input samples for multiple time constants (rows) can be captured at the same time along with downsampled main non-linear filter data path. In certain implementations, decimation and down sampling frequency and phase are programmable to allow for flexibility.

In certain implementations, only one decimated Laguerre input is used for capturing all rows (time constants), which aids in reducing capture buffer space.

CONCLUSION

In the foregoing, it will be appreciated that any feature of any one of the embodiments can be combined or substituted with any other feature of any other one of the embodiments.

Aspects of this disclosure can be implemented in various electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to."

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected). Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. The various features and processes described above may be implemented independently of one another, or may be combined in various ways. All possible combinations and subcombinations of features of this disclosure are intended to fall within the scope of this disclosure.

What is claimed is:

1. A radio frequency (RF) communication system comprising:
    a transmitter configured to output an RF transmit signal; and
    a power amplifier configured to amplify the RF transmit signal,
    wherein the transmitter comprises a digital pre-distortion (DPD) system configured to pre-distort the RF transmit signal, the DPD system including a configurable non-linear filter having a plurality of rows in which at least one row operates with a configurable decimation ratio.

2. The RF communication system of claim 1, wherein the DPD system comprises a plurality of decimators, and a crossbar switch coupled between the plurality of decimators and the plurality of rows of the configurable non-linear filter.

3. The RF communication system of claim 2, wherein at least a portion of the plurality of decimators have a separately controllable decimation ratio.

4. The RF communication system of claim 1, wherein the configurable non-linear filter operates with a plurality of different time constants.

5. The RF communication system of claim 1, wherein the configurable non-linear filter compensates for charge trapping effects of the power amplifier.

6. The RF communication system of claim 1, wherein the configurable non-linear filter is a Laguerre filter.

7. The RF communication system of claim 6, wherein the Laguerre filter operates with a programmable number of filter stages corresponding to matrix columns.

8. The RF communication system of claim 1, wherein a plurality of coefficients of the plurality of rows are programmable.

9. The RF communication system of claim 1, wherein the configurable non-linear filter further comprises a bank of input decimation filters configured to selectively reduce an operating rate of the non-linear filter, and a bank of output interpolation filters configured to compensate for the reduced operating rate provided by the bank of input decimation filters.

10. The RF communication system of claim 1, wherein the configurable non-linear filter comprises two or more rows that share an infinite impulse response (IIR) filter.

11. The RF communication system of claim 10, wherein the IIR filter includes a transposed pipeline structure with a floating memory stage.

12. The RF communication system of claim 1, wherein the configurable non-linear filter further comprises a first plurality of a look-up tables (LUTs) configured to provide data to the plurality of rows of the configurable non-linear filter.

13. The RF communication system of claim 12, wherein the first plurality of LUTs are configured to provide piecewise linear interpolation of a non-linear transfer function.

14. The RF communication system of claim 12, wherein the configurable non-linear filter further comprises a second plurality of LUTs configured to process data outputted from the plurality of rows.

15. The RF communication system of claim 1, wherein the DPD system further comprises a generalized memory polynomial (GMP) circuit that operates in combination with the configurable non-linear filter to provide DPD.

16. The RF communication system of claim 15, wherein the configurable non-linear filter is rate matched to the GMP circuit.

17. The RF communication system of claim 15, wherein the GMP circuit operates on a data stream and the configurable non-linear filter operates on an early version of the data stream.

18. A transmitter for an RF communication system, the transmitter comprising:
   a digital transmit circuit configured to generate an in-phase (I) transmit signal and a quadrature-phase (Q) transmit signal,
   wherein the digital transmit circuit comprises a digital pre-distortion (DPD) system configured to pre-distort the I transmit signal and the Q transmit signal to compensate for downstream power amplifier non-linearity,
   wherein the digital pre-distortion system includes a non-linear filter having a plurality of rows in which at least one row operates with a configurable decimation ratio.

19. The transmitter of claim 18, wherein the DPD system comprises a plurality of decimators, and a crossbar switch coupled between the plurality of decimators and the plurality of rows of the configurable non-linear filter.

20. The transmitter of claim 18, wherein the configurable non-linear filter operates with a plurality of different time constants.

21. The transmitter of claim 18, wherein the configurable non-linear filter is a Laguerre filter.

22. A method of digital pre-distortion in an RF communication system, the method comprising:
   generating an in-phase (I) transmit signal and a quadrature-phase (Q) transmit signal;
   pre-distorting the I transmit signal and the Q transmit signal to compensate for a non-linearity of a power amplifier using a digital pre-distortion (DPD) system; and
   configuring a decimation ratio of at least one row of a non-linear filter of the digital pre-distortion system.

* * * * *